United States Patent [19]

Zahuta et al.

[11] Patent Number: 5,433,639
[45] Date of Patent: Jul. 18, 1995

[54] PROCESSING OF VACUUM-SEALED DEWAR ASSEMBLY

[75] Inventors: Robert E. Zahuta, Lompoc; Leonard E. Peck, Jr., Goleta, both of Calif.

[73] Assignee: Santa Barbara Research Center, Goleta, Calif.

[21] Appl. No.: 315,013

[22] Filed: Sep. 29, 1994

Related U.S. Application Data

[63] Continuation-in-part of Ser. No. 108,413, Aug. 18, 1993, Pat. No. 5,386,920.

[51] Int. Cl.$^6$ ............................. H01J 9/26; H01J 9/39
[52] U.S. Cl. ...................................... 445/40; 445/41; 445/43; 445/70
[58] Field of Search ............... 228/115, 220; 445/44, 445/55, 57, 70, 40, 41

[56] References Cited

U.S. PATENT DOCUMENTS

| | | | |
|---|---|---|---|
| 3,139,678 | 7/1964 | Anthony et al. | 228/115 |
| 3,203,083 | 8/1965 | Obenhaus | 228/116 |
| 3,630,590 | 12/1971 | Strubig et al. | 445/44 X |
| 3,751,800 | 8/1973 | Daniels et al. | 29/625 X |
| 4,166,563 | 9/1979 | Peyraud et al. | 445/70 X |
| 4,382,646 | 5/1983 | Sunde | 445/55 X |
| 4,467,953 | 8/1984 | Yamamoto | 228/116 |
| 4,799,911 | 1/1989 | Relder | 445/70 X |
| 4,799,912 | 1/1989 | Salgó | 445/70 X |
| 4,919,291 | 4/1990 | Romano et al. | 220/2.2 |

FOREIGN PATENT DOCUMENTS 969244  9/1964  United Kingdom ............... 228/115

*Primary Examiner*—Kenneth J. Ramsey
*Attorney, Agent, or Firm*—W. C. Schubert; W. K. Denson-Low

[57] ABSTRACT

A dewar assembly is cleaned, baked out, assembled, and joined in a single vacuum system without exposing the components to ambient atmosphere. The vacuum system preferably has a first chamber with multiple subchambers that can be isolated from each other, and a second chamber that can be isolated from the first chamber. The multiple chambers and subchambers prevent cross contamination during the various process steps, and also permit multiple dewar assemblies to be batch processed at different stages simultaneously. The components of the dewar assembly are loaded into one subchamber and cleaned, and thereafter moved to another subchamber for bakeout. The dewar getter is heated in the second chamber and moved to one of the subchambers for assembly. The components of the dewar assembly are assembled and joined.

15 Claims, 3 Drawing Sheets

's,433,639

PROCESSING OF VACUUM-SEALED DEWAR ASSEMBLY

This application is a continuation-in-part of application Ser. No. 08/108,413, filed Aug. 18, 1993, now U.S. Pat. No. 5,386,920 for which priority is claimed.

BACKGROUND OF THE INVENTION

This invention relates to the processing of dewar assemblies, and, more particularly, to an approach that accomplishes the final cleaning, degassing, assembling, and joining of the dewar in an efficient manner.

One type of infrared sensor utilizes a focal plane array (FPA) of individual sensor elements. The sensor elements are typically photodiodes or photoconductors that produce an electrical output responsive to incident infrared energy. The sensor elements are arranged into an array of suitable size, which may comprise a few elements in a linear array or more than 1000 by 1000 elements in a two-dimensional array.

For the sensor elements to operate most effectively, they must be cooled to a reduced temperature of, for example, about 77K. Cooling of the sensor elements is accomplished by placing the focal plane array into an evacuated enclosure having an infrared-transmissive window. The enclosure, termed a vacuum package, is cooled to the required reduced temperature by cryogenic gas cooling, Joule-Thomson cooling, thermoelectric cooling, or other operable technique. The present invention relates to the method of the fabrication of the vacuum package and sensor system.

In the conventional practice, the vacuum package is formed of a two-part housing. A window housing includes the infrared-transmissive window, and a lower vacuum housing contains the focal plane array, a getter, and related structure. A tip-off tube extends from the side of the lower vacuum housing, and communicates with the interior of the housing.

To accomplish the assembly, the various pieces are carefully cleaned and vacuum baked to remove contaminants. The pieces are sub-assembled and again vacuum baked to remove contaminants. The getter is installed in the housing. The window housing is welded to the lower vacuum housing. A vacuum is drawn on the tip-off tube, and, after evacuation of the interior of the housing through the tip-off tube, the assembly is baked out to remove contaminants. The getter is activated by heating under vacuum. Finally, the tip-off tube is mechanically pinched together and closed off. The interior of the housing is thereby closed and isolated under vacuum. This approach is described in greater detail in U.S. Pat. No. 4,919,291.

The present inventors have recognized that the above-discussed approach, while operable, has disadvantages in some situations. Numerous vacuum bakeouts are required, with a corresponding long production time cycle. Each vacuum bakeout requires a long time to complete, because of the time required to evacuate through the tip-off tube. The repeated exposure to air between bakeouts allows re-adsorption of contaminants in the system. Supplemental cleaning is difficult. The stub of the tip-off tube that remains on the lower vacuum housing may pose a physical obstacle to mounting, external connecting, and other operations that are performed on the vacuum package assembly.

Thus, while the existing approach is operable, it could be improved so as to reduce production costs and to increase the reliability of the sensor system. The present invention provides such an improvement, and also provides related advantages.

SUMMARY OF THE INVENTION

The present invention provides a method for the final processing of vacuum dewars during their fabrication. The approach allows the final processing to be accomplished in a single vacuum system without repeated exposure to the ambient atmosphere. As a result, cleaning, pumpout, and bakeout cycles are completed much more economically than with the conventional approach. The process is also amenable to automated production operations.

In accordance with the invention, a method for the preparation of a dewar assembly comprises the steps of providing a complete set of parts and subassemblies for at least one dewar assembly, providing a first vacuum chamber, placing the parts and subassemblies into the first vacuum chamber, sealing the first vacuum chamber, and evacuating the first vacuum chamber. The method includes removing contaminants from the parts and subassemblies and baking the parts and subassemblies. A dewar getter for each of the dewar assemblies is placed into a second vacuum chamber that is interconnected with the first vacuum chamber by a first chamber/second chamber lock. The second vacuum chamber is evacuated with the second vacuum chamber isolated from the first vacuum chamber. The dewar getter is activated and is thereafter moved from the second vacuum chamber into the first vacuum chamber. The method further includes assembling the parts, subassemblies, and dewar getters to form at least one dewar assembly, and joining the components of a vacuum package enclosure of each of the dewar assemblies with an hermetic seal. The steps following the loading of the parts and subassemblies into the first vacuum chamber are all accomplished without exposing the parts, subassemblies, and dewar getters to ambient atmosphere.

In a preferred embodiment, the first vacuum chamber is subdivided into at least two subchambers, each of which can be isolated from the other subchambers by vacuum locks. Individual steps such as the cleaning step or multiple cleaning steps, the bakeout, the assembly, and the joining are accomplished in the separate subchambers as may be appropriate. Cross contamination is thereby avoided that could otherwise occur from contaminants released during bakeout that might, for example, adversely affect the subsequent joining operation.

The use of multiple subchambers also permits the semi-continuous batch processing of a plurality of dewars at different stages of fabrication, in a single apparatus. For example, some dewars may be in the joining subchamber, while others are in the assembly subchamber. Parts and subassemblies for dewars to be later assembled and joined can be positioned at various earlier stations, such as in the cleaning subchamber or the bakeout subchamber.

The present approach allows great latitude in the selection of the procedures followed in the various steps. For example, one or more vacuum cleaning procedures can be employed, using the same subchamber or different subchambers. Cleaning techniques of most interest include plasma glow discharge cleaning, ultraviolet photon stimulated desorption, infrared heating, ultraviolet cleaning, and ion bombardment. Various robotic, automatic, semiautomatic, or manual assembly techniques can be used. Joining can be by any operable process, such as, for example, a metal gasket between the components, an O-ring gasket between the components, cold metal welding of the components, electron beam welding, or laser welding.

A highly important feature is the activating of the getter in its own second vacuum chamber. The getter is later loaded into the vacuum housing prior to joining and sealed into the housing. Non-evaporative getters require a period of activation under vacuum, preferably at a temperature of about 900° C. for 10 minutes, without any subsequent exposure to ambient atmosphere prior to service. In the conventional approach, the getter is placed into the vacuum housing, the housing is sealed, and a vacuum is drawn on the interior of the housing through the tip-off tube. Once a suitable vacuum is reached, the getter is heated by an electrical current to a temperature of 500°–900° C. for activation. However, in many cases the getter cannot be heated to the higher temperature because of the proximity within the vacuum housing of heat-sensitive sensor components such as a focal plane array (FPA) or electronic devices which are damaged by the heat radiated from the getter during activation. The result of the prior approach is a getter that is not fully activated and is therefore not fully effective in service.

The present approach, by contrast, activates the non-evaporative getter by heating prior to the time that it is assembled into the vacuum housing in proximity to the heat-sensitive components. Consequently, the getter may be fully activated without concern for damaging the other components. One consequence of the prior approach was that, in some cases, the vacuum housings were made larger than otherwise necessary in order to provide a separation of the getter and the heat-sensitive components. That need not be done when assembly is performed according to the present approach.

The entire cleaning, bakeout, assembly, and joining sequence is accomplished without exposing the components of the dewar to ambient atmosphere. Consequently, the components are not re-contaminated between each step. Cleaning, bakeout, and evacuation are performed within the vacuum package enclosure, so that evacuation occurs through a large cross sectional area rather than the small tip-off tube conventionally employed. The processing is thereby greatly accelerated.

Other features and advantages of the present invention will be apparent from the following more detailed description of the preferred embodiment, taken in conjunction with the accompanying drawings, which illustrate, by way of example, the principles of the invention.

SUMMARY OF THE INVENTION

Figure 1:
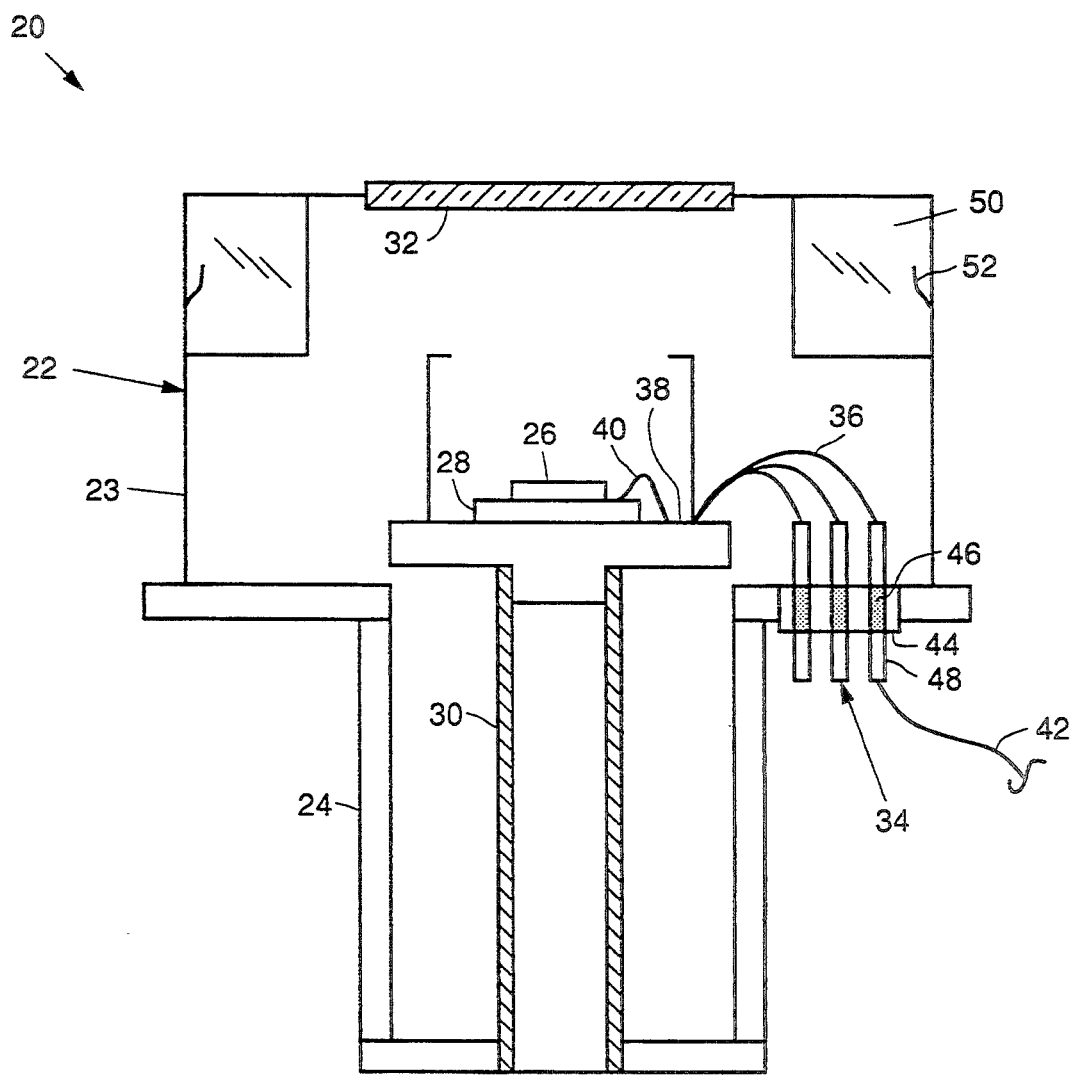
FIG. 1 is a schematic sectional view of a vacuum dewar assembly.

FIG. 1 depicts a dewar assembly 20 that includes a vacuum package enclosure 22 having an upper housing 23 and a lower housing 24 that are assembled together in the final joining operation. Within the vacuum package enclosure 22 is a device 26, in this case a focal plane array (FPA) infrared sensor. The device 26 is mounted on a base 28, which in turn is mounted on a pedestal 30 that is attached to the interior of the vacuum package enclosure 22. The pedestal 30 and thence the device 26 are cooled by a Joule-Thomson cryostat or other cooling means (not shown) to a temperature that is typically about 77° K. or less. The device 26 faces forwardly through a window 32 which is supported in the upper housing 23.

In the assembled and operating form of the dewar assembly 20, the contained volume within the vacuum package enclosure 22 is evacuated. The vacuum package enclosure 22 therefore separates an evacuated space from ambient air. An hermetic seal must be maintained between the interior of the vacuum package enclosure 22 and the exterior.

The dewar assembly 20 includes an electrical feedthrough 34. The feedthrough 34 provides a portion of the electrical connection path from the device 26 to the exterior of the dewar assembly 20. To connect from the feedthrough 34 to the device 26, there is a fine-wire internal lead 36 from the feedthrough 34 to a conductor trace 38 on the surface of the base 28, which in turn connects to another lead 40 that connects to the device 26. Exterior to the feedthrough 34, there is an external electrical connection, here shown to be a soldered lead 42, but which could be a permanent connector, a disconnectable connector, or any other suitable connection means.

The feedthrough 34 is formed of a generally flat feedthrough plate 44 of a ceramic material such as aluminum oxide. Bores 46 are formed through the feedthrough plate 36. Electrical feedthrough pins 48 are hermetically sealed into the bores 38.

An annular getter 50 is positioned within the vacuum package enclosure 22 and is fixed to the inside surface of the wall of the enclosure 22 by clips 52. The preferred getter 50 is a sintered mass of zirconium-graphite or titanium-graphite powders, shaped as an annulus that fits against the inner wall of the enclosure 22. Such getters are available commercially. The getter is activated by heating it in vacuum to a temperature of 900° C. for 10 minutes, so that oxides and other contaminants on the surface of the getter material are dissolved into the getter material. Fresh surface is thereby exposed, and the getter is ready for service to getter gaseous contaminants within the enclosure 22.

Figure 2:
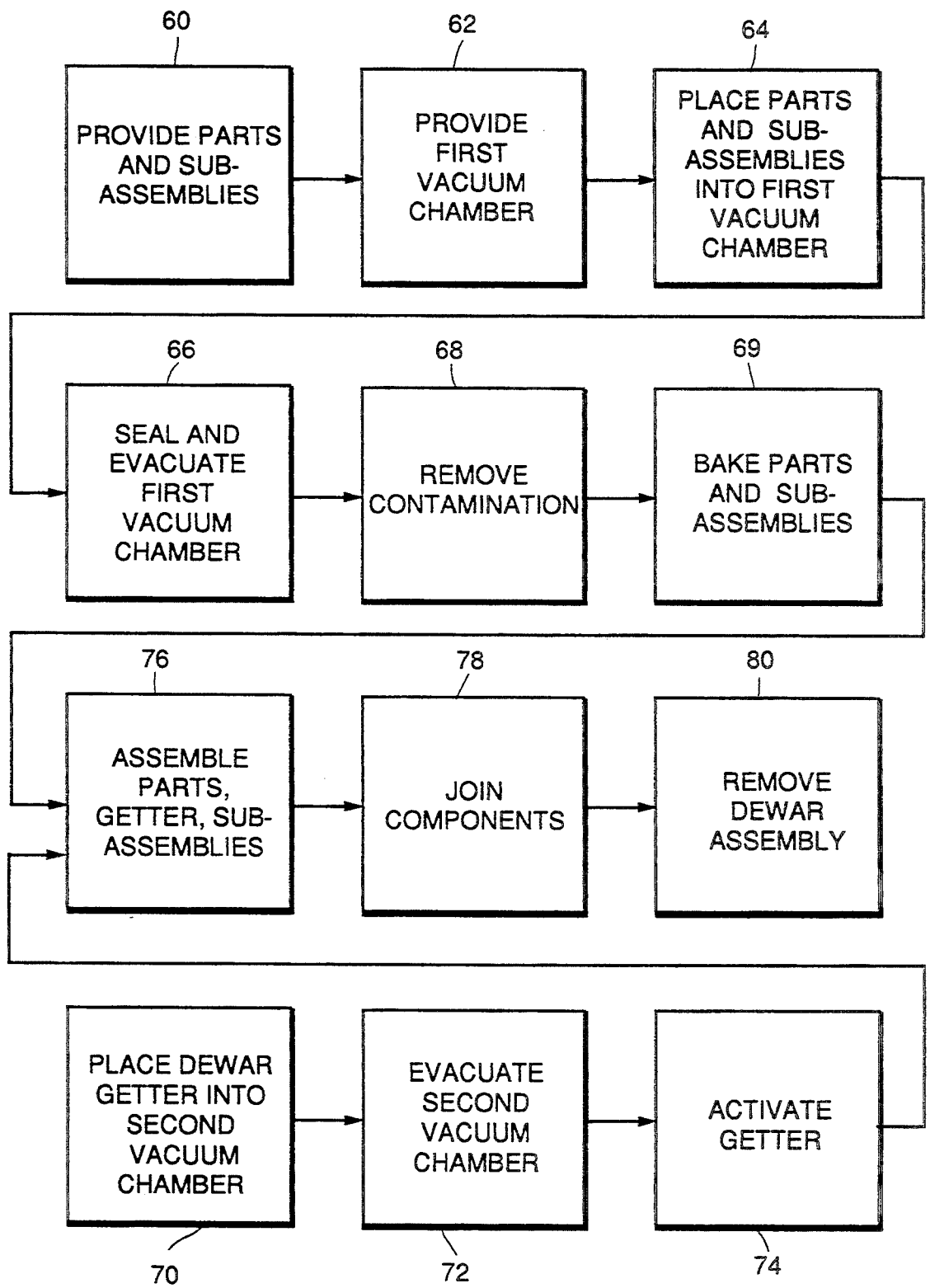
FIG. 2 is a flow chart of a method for preparing a vacuum dewar assembly.
Figure 3:
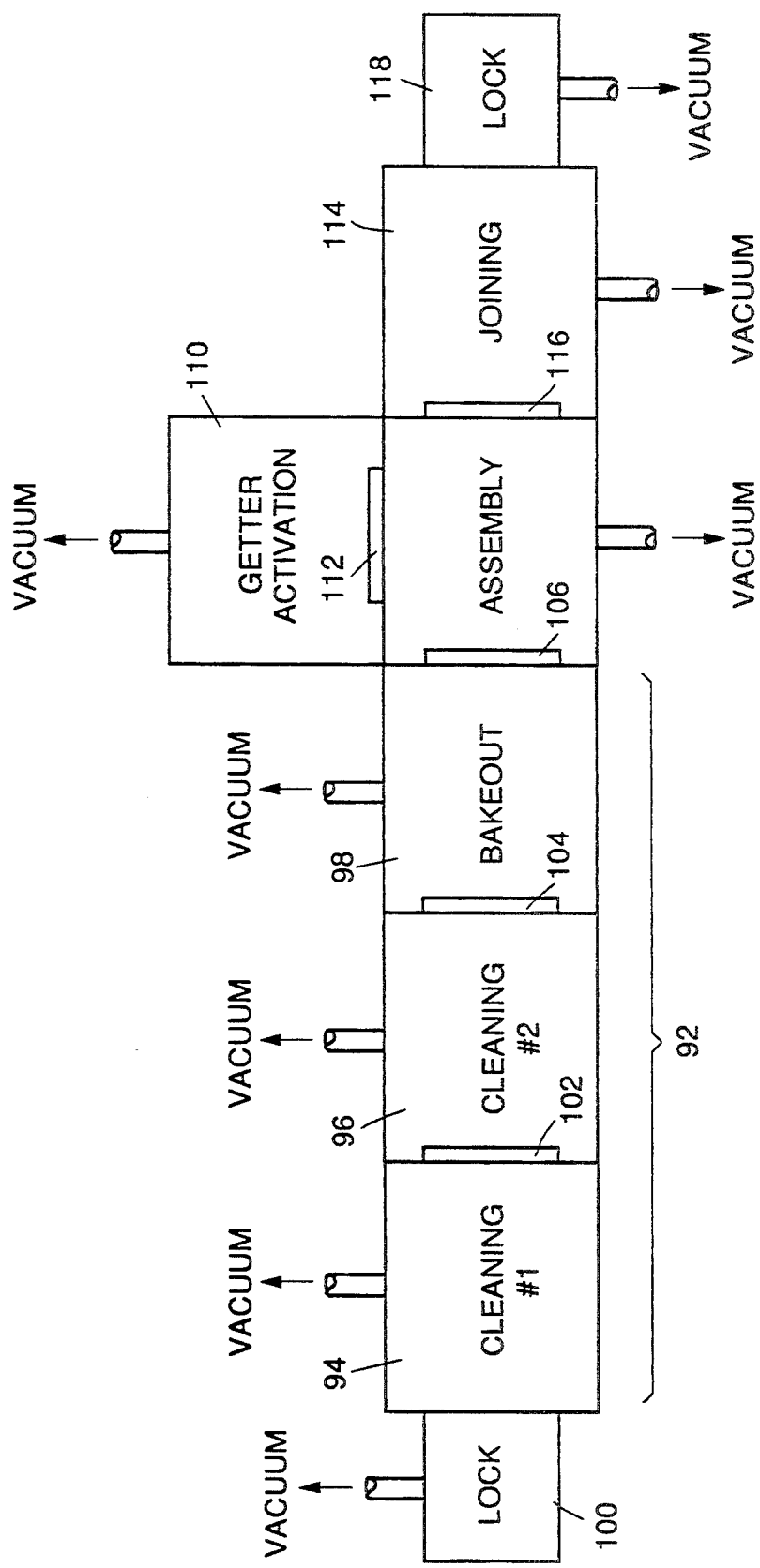
FIG. 3 is a diagrammatic view of a multichamber dewar fabrication system.

The prior description of a general form of the dewar assembly is provided by way of background. The present invention is not concerned with the details of the structure of the dewar assembly. Instead, the present invention deals with a method by which the dewar assembly is fabricated, and in particular a method for performing the final cleaning, bakeout, assembly, and joining of the dewar assembly after the parts and subassemblies have been previously prepared. The present invention may therefore be used with many types of dewar assemblies. FIG. 2 depicts a method for accomplishing the latter portion of the fabrication operation, and FIG. 3 shows a vacuum apparatus that is useful in the practice of the process.

When a dewar assembly such as that shown in FIG. 1 is prepared, various parts and subassemblies are first fabricated and furnished, numeral 60. For example, the window 32, upper housing 23, lower housing 24, and pedestal 30 are usually prepared as parts. The device 26 and base 28 are usually prepared as a subassembly, and the feedthrough plate 44 and pins 48 are prepared as another subassembly. The exact configuration of each part and subassembly depends upon the type of dewar assembly, and is not a part of the present invention.

A processing system 90 is provided. The processing system 90 includes multiple vacuum chambers which are discussed in terms of their functions. A first vacuum chamber 92 is provided, numeral 62. The parts and subassemblies are placed or loaded into the first vacuum chamber 92, numeral 64, and the first vacuum chamber is sealed and evacuated using a vacuum pump, numeral 66.

The first vacuum chamber 92 preferably comprises multiple subchambers, each separated from the other subchambers by a vacuum-tight lock. In FIG. 3, three subchambers are illustrated, but more or fewer could be used as dictated by the processing operation. A first subchamber 94 is used for a first cleaning operation, a second subchamber 96 is used for a second cleaning operation, and a third subchamber 98 is used for a bakeout operation. Each subchamber is therefore fitted with the necessary internal structure, such as cleaning apparatus or a bakeout heater. These detailed internal structures are not illustrated in FIG. 3.

A gas-tight first vacuum lock 100 provides external access to the first vacuum chamber 92. A gas-tight second vacuum lock 102 separates the first sub chamber 94 from the second subchamber 96. A gas-tight third vacuum lock 104 separates the second subchamber 96 from the third subchamber 98. A gas-tight fourth vacuum lock 106 separates the third subchamber 98 from an evacuated assembly chamber 108. The fourth vacuum lock 106 thus provides external access to the first vacuum chamber 92 at the end opposite the first vacuum lock 100.

Each of the subchambers can be isolated from the other subchambers, the external environment, and the downstream assembly chamber. Each subchamber can therefore be evacuated separately from the others. An important advantage of this process is the capability to prevent contaminants produced during the processing in one of the subchambers to reach the other subchambers.

Contaminants are removed from the parts and subassemblies, numeral 68. In the illustrated processing system 90, two cleaning stages are provided for illustration. There may be multiple cleaning stages because some parts and subassemblies may require different cleaning than other parts and subassemblies, and the present approach gives complete flexibility in this regard. Examples of types of cleaning operations that may be used in vacuum include plasma glow discharge cleaning, ultraviolet photon stimulated desorption, infrared heating, ultraviolet cleaning, and ion bombardment, all of which are known in the art. Again by way of example, the first sub chamber 94 might be provided with the apparatus for performing ultraviolet cleaning and the second subchamber 96 might be provided with the apparatus for performing ion bombardment. Some parts or subassemblies might be most effectively cleaned by one process but should not be exposed to the other. In these cases, the parts or subassemblies are loaded into the cleaning subchamber 94 or 96 that is appropriate for it.

After cleaning, many of the parts and components are baked in vacuum, numeral 69, in the third subchamber 98. The bakeout temperature is typically up to about 250° C. In this case, only a single bakeout subchamber 98 is shown, but there could be additional such subchambers. The bakeout removes additional adsorbed contaminants from the surfaces of the parts and components. After bakeout is complete, the parts and components are moved to the assembly chamber 108.

The cleaning operation 68, the bakeout operation 69, and any of the other steps of the processing can be accomplished in the presence of ultraviolet light to further desorb contaminants.

As a separate operation, preferably conducted in parallel with the preceding steps, the non-evaporative getter 50 for the dewar is placed, numeral 70, into a second vacuum chamber 110 that interconnects to the assembly chamber 108 through a fifth vacuum lock 112. The second vacuum chamber 110 is evacuated, numeral 72. The getter material is activated, numeral 74, by heating the getter material to a temperature of up to about 900° C. for 10 minutes using electrodes, resistive heaters, radio frequency induction heaters, or other operable heating device. After completion of the activating, the getter material is moved to the assembly chamber 108 through the fifth vacuum lock 112.

In the assembly chamber 108, the parts, subassemblies, and getter are assembled together, numeral 76. Assembly may be accomplished by any of a variety of techniques, including for example robotic assembly, other fully or partially automated assembly, or manual assembly as by using manipulators. The assembly is moved to a vacuum joining chamber 114 through a sixth vacuum lock 116.

In the vacuum joining chamber 114, the assembled components are joined permanently or semipermanently using any appropriate technique, numeral 78. Examples of joining techniques include a metal gasket placed between the components, an O-ring gasket placed between the components, cold metal welding of the components, electron beam welding, and laser welding. FIG. 2 shows only a single assembly chamber 108 and a single joining chamber 114, but there could be others as appropriate for the particular type of dewar assembly. For example, it might be appropriate to electron beam weld two particular components together, so a first joining chamber could be provided with an electron beam welder. Two other components might be more properly joined using laser welding, and a second joining chamber would be provided with a laser welder. The various parts and subassemblies to be join ed would be moved to the appropriate joining chambers.

As a last part of the joining step 80, the upper housing 23 and the lower housing 24 are joined with an hermetic seal. Any operable technique can be used, such as, for example, pressure diffusion bonding, electron beam welding, or brazing.

After joining, the finished dewar assembly 20 is removed from the joining chamber 114 through a seventh vacuum lock 118, numeral 80. Because the first vacuum lock 100 and the seventh vacuum lock 118 communicate between the interior of the processing system 90 and the ambient atmosphere, they are preferably formed with an intermediate vacuum compartment so that the interior of the processing system is never exposed to the ambient atmosphere.

The steps 66, 68, 69, 70, 72, 74, 76, and 78 are accomplished with the subassemblies and parts in vacuum. From their loading in to the processing system 90 until the final dewar assembly is removed, these components are never exposed to the ambient atmosphere. Consequently, once cleaned they are not re-contaminated in a manner that would require repetitive cleaning steps. After the getter is activated in the second vacuum chamber 110, it is loaded into the housing. The vacuum package is enclosure thereafter sealed in vacuum, so that the getter is never exposed to the ambient atmosphere after it is activated.

The processing system 90 and the method of FIG. 3 are particularly suitable for the semi-continuous commercial processing of large numbers of dewar assemblies. The components for some dewar assemblies can be in the cleaning stations, the components for others can be in the joining station, the components for others can be in assembly, and other dewar assemblies can be in the final joining operations. Each type of operation can be conducted without interfering with the others, because the system 90 includes the various locks described previously to prevent cross contamination between various processing operations.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for the preparation of a dewar assembly, comprising the steps of:
   providing a complete set of parts and subassemblies for at least one dewar assembly;
   providing a first vacuum chamber;
   placing the parts and subassemblies into the first vacuum chamber;
   sealing the first vacuum chamber;
   evacuating the first vacuum chamber;
   removing contaminants from the parts and subassemblies;
   baking the parts and subassemblies;
   placing a dewar getter for each dewar assembly into a second vacuum chamber that is interconnected with the first vacuum chamber by a first chamber/second chamber lock;
   evacuating the second vacuum chamber with the second vacuum chamber isolated from the first vacuum chamber;
   activating the dewar getter;
   moving the dewar getter from the second vacuum chamber into the first vacuum chamber;
   assembling the parts, subassemblies, and dewar getters to form at least one dewar assembly; and
   joining the components of a vacuum package enclosure of each of the dewar assemblies with an hermetic seal, the steps of removing contaminants, baking the parts and subassemblies, placing a dewar getter, evacuating the second vacuum chamber, activating the dewar getter, moving the at least one dewar getter, assembling the parts, subassemblies, and dewar getters, and joining the components being accomplished without exposing the parts, subassemblies, and dewar getter to ambient atmosphere.

2. The method of claim 1, wherein the step of providing a complete set of parts and subassemblies for at least one dewar assembly includes the step of
   providing a complete set of parts and subassemblies for a plurality of dewar assemblies.

3. The method of claim 1, wherein the step of providing a first vacuum chamber includes the step of
   providing a first vacuum chamber having at least two subchambers, each of which subchambers is interconnected to at least one other subchamber by a respective subchamber lock.

4. The method of claim 8, wherein the steps of removing contaminants and baking include the step of
   moving the parts and subassemblies progressively from one subchamber to another subchamber, so that the steps of removing contaminants and baking are performed in different subchambers.

5. The method of claim 1, wherein the step of removing contaminants includes the step of
   removing contaminants using a cleaning technique selected from the group consisting of plasma glow discharge cleaning, ultraviolet photon stimulated desorption, infrared heating, ultraviolet cleaning, and ion bombardment.

6. The method of claim 1, wherein the step of joining includes the step of
   joining the components using a joining technique selected from the group consisting of a metal gasket between the components, an O-ring gasket between the components, cold metal welding of the components, electron beam welding, and laser welding.

7. The method of claim 1, wherein the step of providing a complete set of parts and subassemblies includes the step of
   providing a vacuum package enclosure having no vacuum tip-off tube.

8. The method of claim 1, wherein the step of providing a complete set of parts and subassemblies includes the step of
   providing an infrared detector.

9. A method for the preparation of a dewar assembly, comprising the steps of:
   providing a complete set of parts and subassemblies for a plurality of dewar assemblies;
   providing a first vacuum chamber having a first subchamber and a second subchamber, the first subchamber and second subchamber being interconnected with a subchamber lock;
   placing the parts and subassemblies into the first subchamber;
   sealing the first vacuum chamber;
   evacuating the first vacuum chamber;
   removing contaminants from the parts and subassemblies with the parts and subassemblies in the first subchamber;
   moving the parts and subassemblies from the first subchamber to the second subchamber, and thereafter closing the subchamber lock;
   baking the parts and subassemblies in the second subchamber;
   placing the dewar getters into a second vacuum chamber that is interconnected with the first vacuum chamber by a first chamber/second chamber lock;
   evacuating the second vacuum chamber with the second vacuum chamber isolated from the first vacuum chamber;
   activating the dewar getters;
   moving the dewar getters from the second vacuum chamber into the first vacuum chamber;
   assembling the parts, subassemblies, and dewar getters to form a plurality of dewar assemblies; and
   joining the components of a vacuum package enclosure of each dewar assembly with an hermetic seal, the steps of removing contaminants, moving the parts and subassemblies, baking the parts and subassemblies, placing the dewar getters into a second vacuum chamber, evacuating the second vacuum chamber, activating the dewar getters, moving the dewar getters, assembling the parts, subassemblies, and dewar getters, and joining the components of a vacuum package enclosure of each dewar assembly with an hermetic seal being performed without exposing the parts, subassemblies, and dewar getters to ambient atmosphere.

10. The method of claim 9, wherein the step of removing contaminants includes the step of removing contaminants using a cleaning technique selected from the group consisting of plasma glow discharge cleaning, ultraviolet photon stimulated desorption, infrared heating, ultraviolet cleaning, and ion bombardment.

11. The method of claim 9, wherein the step of joining includes the step of joining the components using a joining technique selected from the group consisting of a metal gasket between the components, an O-ring gasket between the components, cold metal welding of the components, electron beam welding, and laser welding.

12. The method of claim 9, wherein the step of providing a complete set of parts and subassemblies includes the step of providing a vacuum package enclosure having no vacuum tip-off tube.

13. The method of claim 9, wherein the step of providing a complete set of parts and subassemblies includes the step of providing an infrared detector.

14. The method of claim 9, wherein the step of providing a first vacuum chamber includes the step of providing a first vacuum chamber having a third subchamber that is interconnected to the first subchamber and second subchamber with a third subchamber lock, and wherein the step of assembling includes the step of assembling the parts, subassemblies, and dewar getters in the third subchamber.

15. The method of claim 14, wherein the step of providing a first vacuum chamber includes the step of providing a first vacuum chamber having a fourth subchamber that is interconnected to the first, second, and third subchambers and second subchamber with a fourth subchamber lock, and wherein the step of assembling includes the step of joining the components in the fourth subchamber.

* * * * *